(12) United States Patent
Huang et al.

(10) Patent No.: US 11,942,007 B1
(45) Date of Patent: Mar. 26, 2024

(54) TRANSPARENT DISPLAY DEVICE

(71) Applicant: InnoLux Corporation, Miao-Li County (TW)

(72) Inventors: Yu-Chia Huang, Miao-Li County (TW); Tsung-Han Tsai, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/052,907

(22) Filed: Nov. 4, 2022

Related U.S. Application Data

(63) Continuation of application No. 17/467,919, filed on Sep. 7, 2021, now Pat. No. 11,513,625.

(30) Foreign Application Priority Data

Oct. 13, 2020 (CN) .......................... 202011088786.9

(51) Int. Cl.
| | | |
|---|---|---|
| G06F 3/044 | (2006.01) | |
| G06F 3/041 | (2006.01) | |
| G09F 9/33 | (2006.01) | |
| H10K 50/84 | (2023.01) | |
| H10K 59/122 | (2023.01) | |

(52) U.S. Cl.
CPC ............... *G09F 9/33* (2013.01); *H10K 50/84* (2023.02); *H10K 59/122* (2023.02)

(58) Field of Classification Search
CPC ................. G06F 3/0412; G06F 3/0446; G06F 2203/04112
See application file for complete search history.

(56) References Cited

U.S. PATENT DOCUMENTS

2021/0320284 A1* 10/2021 Park ..................... H10K 50/844
2022/0043528 A1* 2/2022 Kim ..................... G06F 3/0443

* cited by examiner

*Primary Examiner* — Deeprose Subedi
(74) *Attorney, Agent, or Firm* — McClure, Qualey & Rodack, LLP

(57) ABSTRACT

A transparent display device is provided. The transparent display device includes a display unit having a circuit area and a transparent area. The display unit includes a plurality of signal lines located in the circuit area, a plurality of pixel circuits electrically connected to the signal lines and located in the circuit area, a plurality of light-emitting elements driven by the pixel circuits and located in the circuit area, and an encapsulation layer located in the circuit area and the transparent area. A first thickness of the encapsulation layer located in the circuit area is different from a second thickness of the encapsulation layer located in the transparent area.

12 Claims, 9 Drawing Sheets

TRANSPARENT DISPLAY DEVICE

CROSS REFERENCE TO RELATED APPLICATIONS

This application is a Continuation of application Ser. No. 17/467,919, filed on Sep. 7, 2021, now U.S. Pat. No. 11,513,625, which claims priority of China Patent Application No. 202011088786.9, filed on Oct. 13, 2020, the entirety of which are incorporated by reference herein.

BACKGROUND

Technical Field

The present disclosure relates to a display device, and in particular it relates to a transparent display device.

Description of the Related Art

The touch electrodes used in current transparent touch display devices include indium tin oxide (ITO) or silver nanowires. However, the above materials still have many shortcomings in terms of their electrical or physical properties. Therefore, the material or design of a touch electrode designed for use in a transparent touch display device is still one of the key directions of research and development.

SUMMARY

In accordance with one embodiment of the present disclosure, a transparent display device is provided. A transparent display device includes a display unit having a circuit area and a transparent area. The display unit includes a plurality of signal lines located in the circuit area, a plurality of pixel circuits electrically connected to the signal lines and located in the circuit area, a plurality of light-emitting elements driven by the pixel circuits and located in the circuit area, and an encapsulation layer located in the circuit area and the transparent area. A first thickness of the encapsulation layer located in the circuit area is different from a second thickness of the encapsulation layer located in the transparent area.

In accordance with one embodiment of the present disclosure, a transparent display device is provided. A transparent display device includes a display unit. The display unit includes a circuit area and a transparent area. The circuit area includes a plurality of signal lines, a plurality of pixel circuits electrically connected to the signal lines, and a plurality of light-emitting elements driven by the pixel circuits. The transparent area does not overlap the plurality of light-emitting elements.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
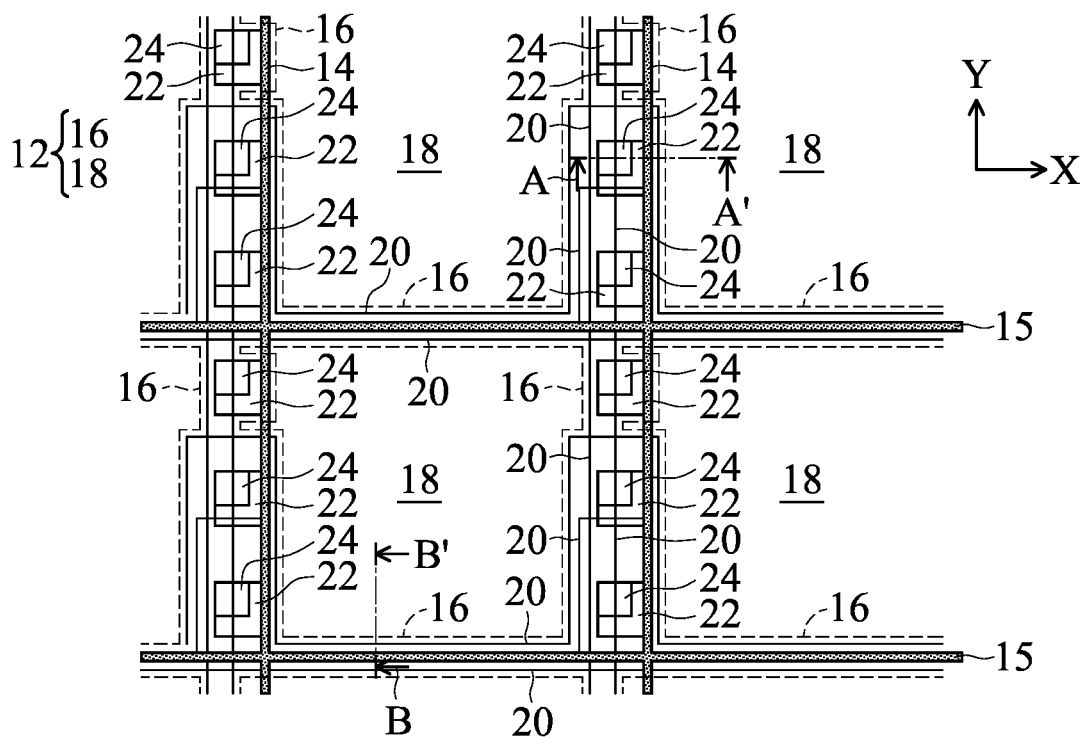
FIG. 1 is a schematic top view of a transparent touch display device in accordance with one embodiment of the present disclosure.

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method.

In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned to different directions (such as rotated 45 degrees or other directions), the spatially related adjectives used in it will also be interpreted according to the turned position.

Herein, the terms "about", "around" and "substantially" typically mean a value is in a range of +/−20% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms "first", "second", "third", etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 2:
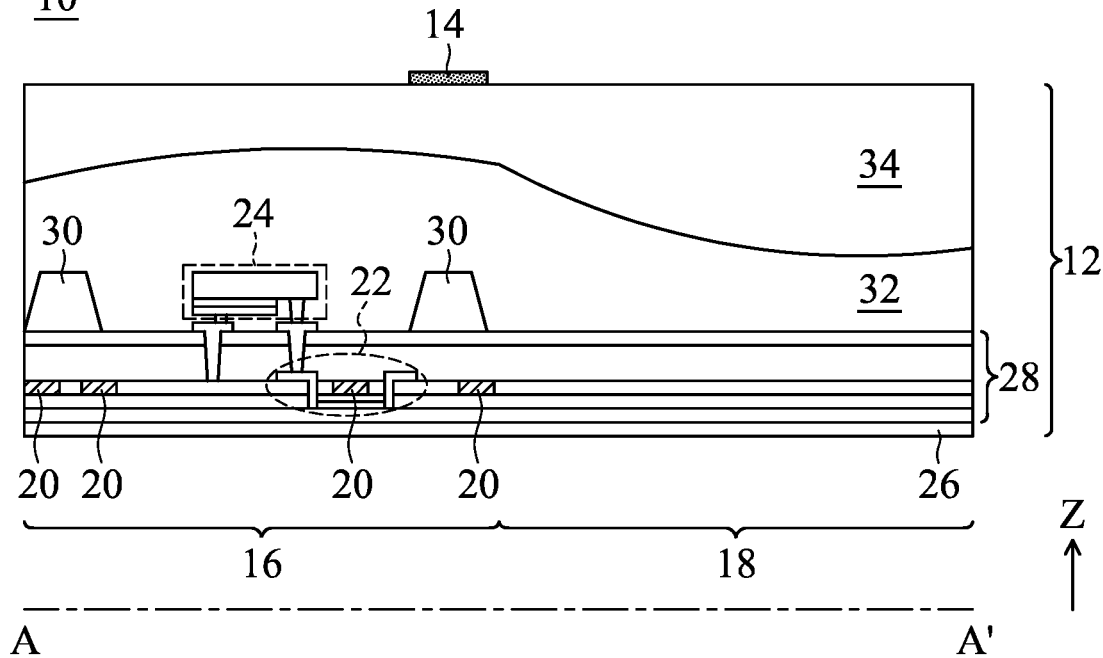
FIG. 2 is a schematic cross-sectional view of a transparent touch display device obtained along A-A' section line in FIG. 1 in accordance with one embodiment of the present disclosure.
Figure 3:
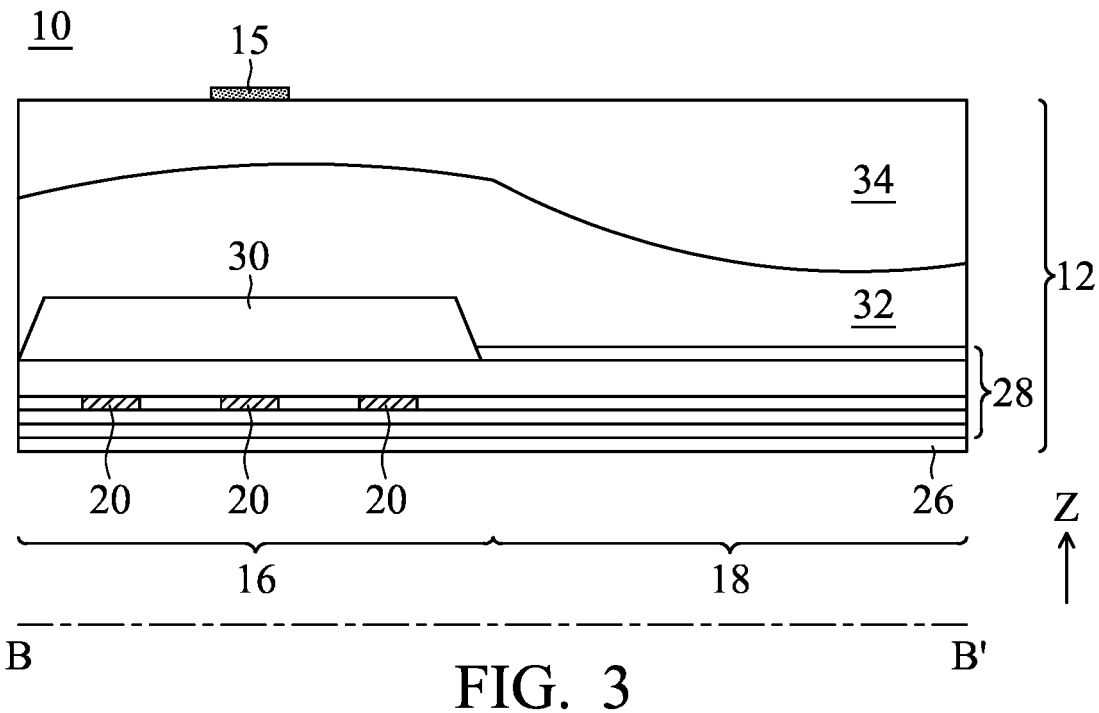
FIG. 3 is a schematic cross-sectional view of a transparent touch display device obtained along B-B' section line in FIG. 1 in accordance with one embodiment of the present disclosure.

Referring to FIGS. 1-3, in accordance with one embodiment of the present disclosure, a transparent touch display device 10 is provided. FIG. 1 is a schematic top view of the transparent touch display device 10. FIG. 2 is a schematic cross-sectional view obtained along A-A' section line in FIG. 1. FIG. 3 is a schematic cross-sectional view obtained along B-B' section line in FIG. 1.

In the embodiment shown in FIGS. 1-3, the transparent touch display device 10 includes a display unit 12 and touch electrodes (14 and 15). The display unit 12 includes a circuit area 16 and transparent areas 18. The configuration of the circuit area 16 is explained below with FIG. 1. A part of the circuit area 16 extends along a first direction Y. Another part of the circuit area 16 extends along a second direction X. Since the first direction Y and the second direction X are staggered (for example, perpendicular to each other), and the transparent areas 18 are alternately arranged between the circuit area 16, the circuit area 16 may constitute a mesh-shaped circuit area. The circuit area 16 includes opaque elements, for example, a plurality of signal lines 20, a plurality of pixel circuits 22, a plurality of light-emitting elements 24 or black matrix (not shown). That is, the range of the circuit area 16 is defined by the largest area surrounded by connecting the edges of the opaque elements to each other.

In the circuit area 16, the signal line 20 may be a line for transmitting electrical signals, for example, a scan line connected to a gate, and a data line connected to a source. The pixel circuit 22 refers to a circuit used to drive the light-emitting element 24 in a single pixel, for example, a 7T2C-type circuit structure comprising seven thin film transistors and two capacitors. The light-emitting elements 24 may include light-emitting diode (LED), for example, organic light-emitting diode (OLED), inorganic light-emitting diode, mini LED, micro LED, quantum dot, QDLED, Q-LED, fluorescence, phosphor, other suitable materials, or a combination of the above materials, but not limited thereto. The pixel circuits 22 may be electrically connected to the signal lines 20. The light-emitting elements 24 may be driven by the pixel circuits 22. The transparent area 18 is defined as the area outside the circuit area 16.

The touch electrodes (14 and 15) refer to electrodes that receive touch drive signals or sense touch signals. In the embodiment shown in FIGS. 1-3, the circuit area 16 may be configured with the touch electrodes 14 extending in the first direction Y and the touch electrodes 15 extending in the second direction X, but not limited thereto. Since the touch electrodes (14 and 15) can be arranged in the aforementioned mesh-shaped circuit area 16, the touch electrodes (14 and 15) can constitute a mesh-shaped touch electrode, but not limited thereto. As shown in FIG. 1, the touch electrodes 14 extending in the first direction Y overlap the circuit area 16, and the touch electrodes 15 extending in the second direction X overlap the circuit area 16. The term "overlap" here means that the touch electrodes (14 and 15) and the circuit area 16 mostly overlap in the normal direction Z of the substrate 26. For example, if more than 50% of the touch electrodes (14 and 15) overlap the circuit area 16, it means that the touch electrodes (14 and 15) overlap the circuit area 16. The normal direction Z of the substrate 26 is perpendicular to the first direction Y, and also perpendicular to the second direction X. In the circuit area 16, the touch electrodes 14 do not overlap the light-emitting elements 24 and do not extend into the transparent areas 18, but is not limited thereto. The touch electrodes 15 do not extend into the transparent areas 18 either, but is not limited thereto. In the embodiment shown in FIGS. 1-3, the touch electrodes (14 and 15) may include conductive materials, such as metals. The metal mesh-shaped touch electrodes (14 and 15) have the advantages of low resistance, high malleability and/or improved uniformity.

Referring to FIGS. 2 and 3, the detailed structure of the display unit 12 and the arrangement of the touch electrodes (14 and 15) are further illustrated by the cross-sectional schematic diagrams of the transparent touch display device 10. FIG. 2 mainly discloses the component structures in the circuit area 16 (including the signal lines 20, the pixel circuits 22, and the light-emitting elements 24) extending along the first direction Y and in the adjacent transparent area 18 in the display unit 12. FIG. 3 mainly discloses the component structures in the circuit area 16 (including the signal lines 20) extending along the second direction X and in the adjacent transparent area 18 in the display unit 12. As shown in FIG. 2, the display unit 12 includes the circuit area 16 and the transparent area 18. The display unit 12 includes the substrate 26, an insulating layer 28, the signal lines 20, the pixel circuit 22, the light-emitting element 24, retaining wall structures 30, an encapsulation layer 32, and a planar layer 34. The insulating layer 28 is disposed on the substrate 26. The signal lines 20 and the pixel circuit 22 are disposed in the insulating layer 28, are electrically connected to each other, and are located in the circuit area 16. The above-mentioned so-called "disposed in the insulating layer 28" means that the insulating layer 28 may include a plurality of sub-layers. The signal lines 20 and the pixel circuit 22 may be arranged on different or the same sub-layers according to various requirements, and are covered by another sub-layer. The light-emitting element 24 is disposed on the insulating layer 28 and located in the circuit area 16. The light-emitting element 24 is electrically connected to the pixel circuit 22 and is driven by the pixel circuit 22. The retaining wall structures 30 are disposed on the insulating layer 28 and located in the circuit area 16. The retaining wall structures 30 are disposed adjacent to the light-emitting element 24 (for example, surround the light-emitting element 24). The encapsulation layer 32, for example, completely covers the insulating layer 28, the light-emitting element 24, and the retaining wall structures 30. The planar layer 34 is disposed on the encapsulation layer 32.

Regarding the configuration of the touch electrode 14, as shown in FIG. 2, the touch electrode 14 is disposed on the planar layer 34 and located in the circuit area 16. The position of the touch electrode 14 corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 does not overlap the light-emitting element 24 in the normal direction Z of the substrate 26 and does not extend into the transparent area 18 adjacent to the circuit area 16, but is not limited thereto.

Referring to FIG. 3, the display unit 12 includes the circuit area 16 and the transparent area 18. The display unit 12 includes the substrate 26, the insulating layer 28, the signal lines 20, the retaining wall structure 30, the encapsulation layer 32, and the planar layer 34. The insulating layer 28 is disposed on the substrate 26. The signal lines 20 are disposed in the insulating layer 28 and located in the circuit area 16. The retaining wall structure 30 is disposed on the insulating layer 28 and located in the circuit area 16. In addition, the encapsulation layer 32, for example, completely covers the insulating layer 28 and the retaining wall structure 30. The planar layer 34 is disposed on the encapsulation layer 32.

Regarding the configuration of the touch electrode 15, as shown in FIG. 3, the touch electrode 15 is disposed on the planar layer 34 and located in the circuit area 16. The position of the touch electrode 15 corresponds to the position of the retaining wall structure 30 and part of the signal lines 20. In other words, the position of the touch electrode 15 overlaps the position of the retaining wall structure 30 and part of the signal lines 20 in the normal direction Z of the substrate 26. The touch electrode 15 does not extend into the transparent area 18 adjacent to the circuit area 16, but is not limited thereto.

Figure 4:
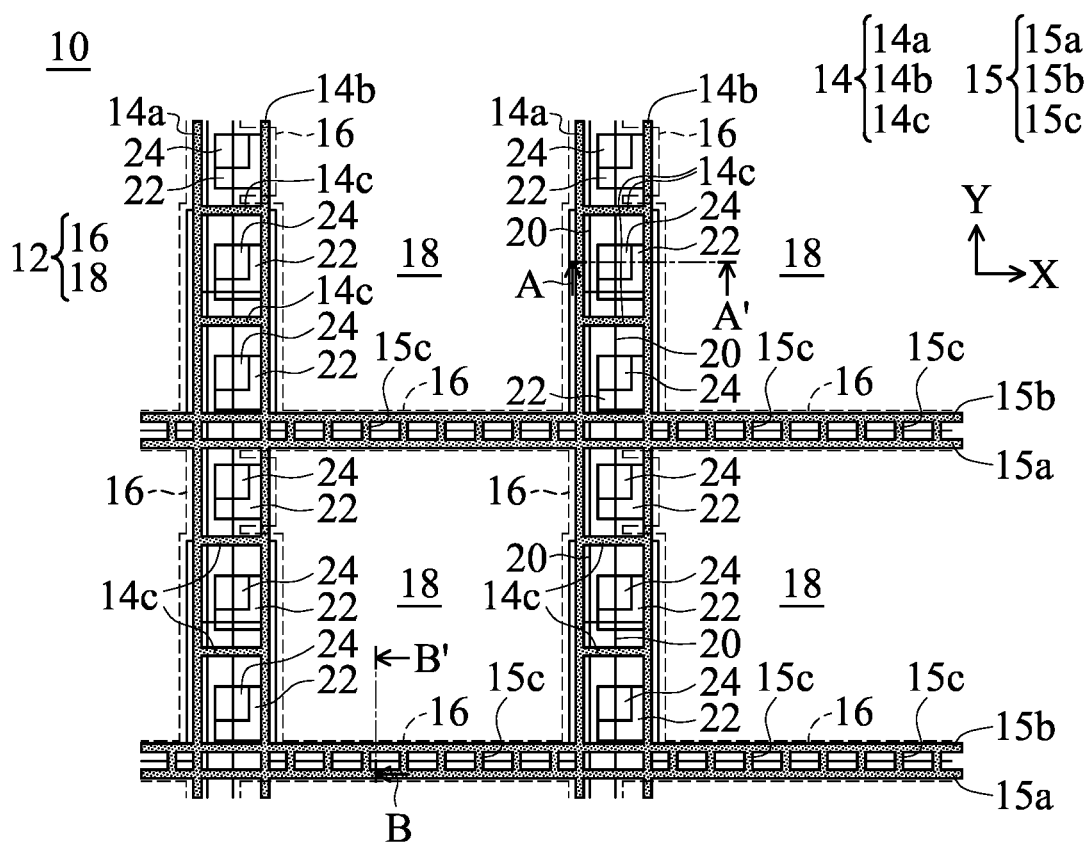
FIG. 4 is a schematic top view of a transparent touch display device in accordance with one embodiment of the present disclosure.
Figure 5:
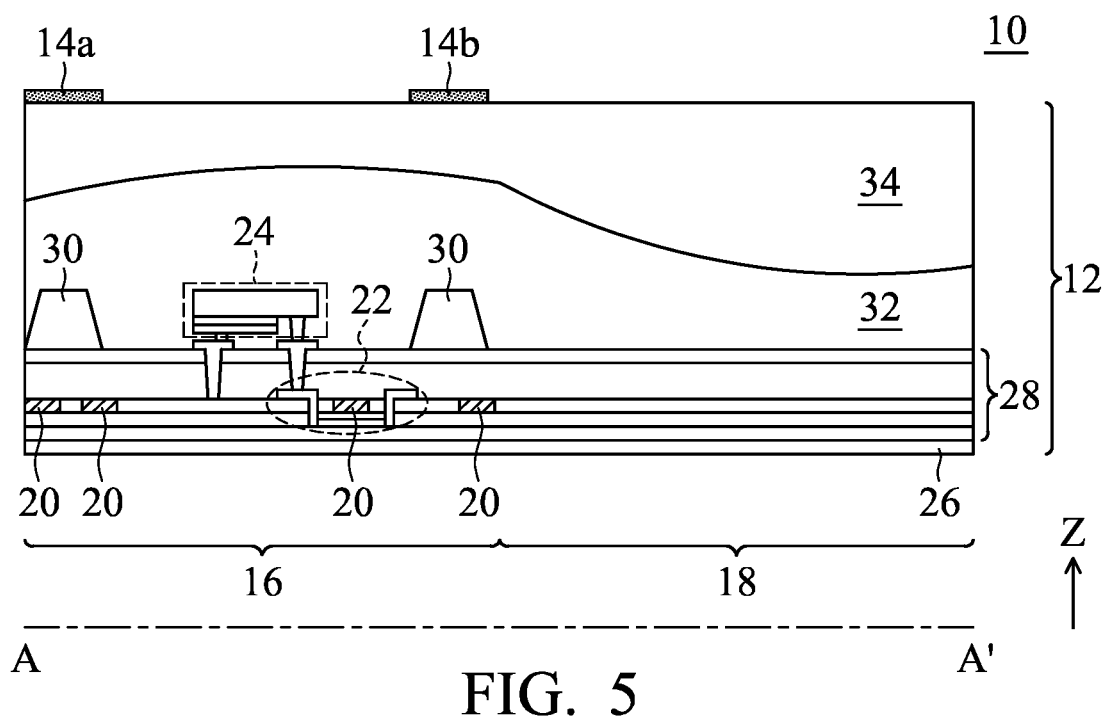
FIG. 5 is a schematic cross-sectional view of a transparent touch display device obtained along A-A' section line in FIG. 4 in accordance with one embodiment of the present disclosure.
Figure 6:
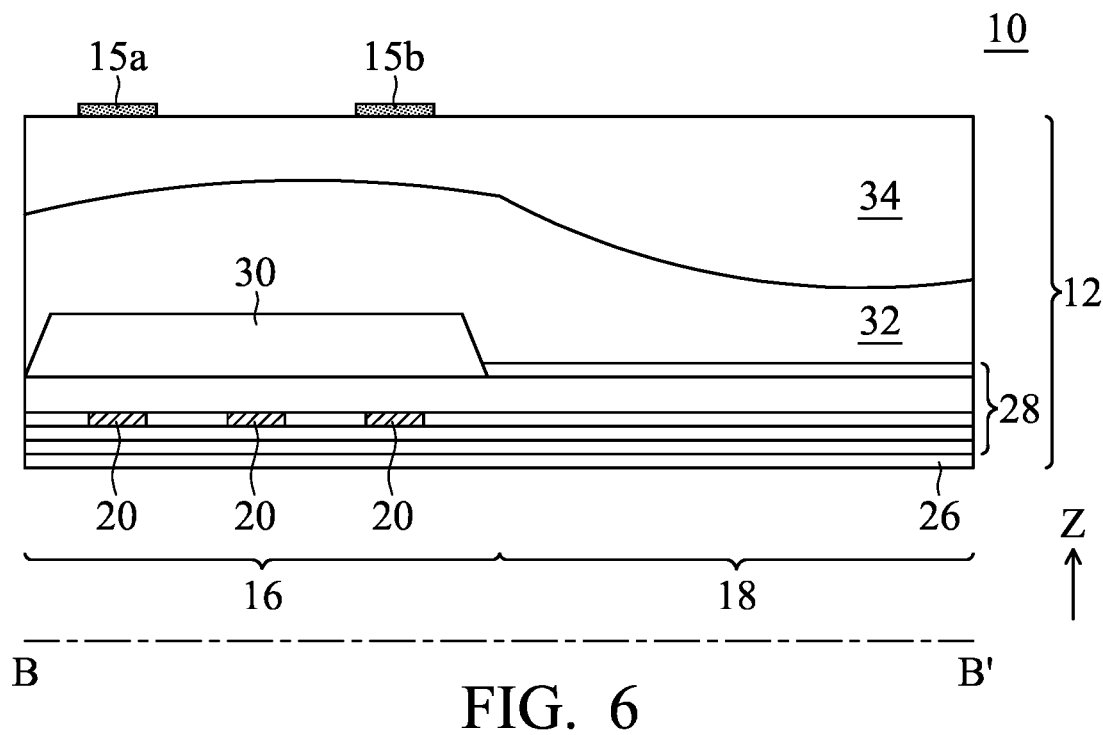
FIG. 6 is a schematic cross-sectional view of a transparent touch display device obtained along B-B' section line in FIG. 4 in accordance with one embodiment of the present disclosure.

Referring to FIGS. 4-6, in accordance with one embodiment of the present disclosure, a transparent touch display device 10 is provided. FIG. 4 is a schematic top view of the transparent touch display device 10. FIG. 5 is a schematic cross-sectional view obtained along A-A' section line in FIG. 4. FIG. 6 is a schematic cross-sectional view obtained along B-B' section line in FIG. 4.

In the embodiment shown in FIGS. 4-6, the transparent touch display device 10 includes a display unit 12 and touch electrodes (14 and 15). The display unit 12 includes a circuit area 16 and transparent areas 18. The configuration of the circuit area 16, and the many components (including the signal lines 20, the pixel circuits 22, and the light-emitting elements 24) disposed in the area and the electrical connection relationship thereamong (from top view) are similar to FIG. 1, and they are not repeated here. The transparent area 18 is defined as the area outside the circuit area 16.

The touch electrodes (14 and 15) refer to electrodes that receive touch drive signals or sense touch signals. In the embodiment shown in FIGS. 4-6, the circuit area 16 extending in the first direction Y is configured with first touch electrodes 14a, second touch electrodes 14b and third touch electrodes 14c, wherein the first touch electrodes 14a and the second touch electrodes 14b are correspondingly arranged to each other, are substantially parallel to each other, and extend along the first direction Y. The third touch electrodes 14c are connected to the first touch electrodes 14a and the second touch electrodes 14b. Similarly, the circuit area 16 extending in the second direction X is configured with first touch electrodes 15a, second touch electrodes 15b and third touch electrodes 15c, wherein the first touch electrodes 15a and the second touch electrodes 15b are correspondingly arranged to each other, are substantially parallel to each other, and extend along the second direction X. The third touch electrodes 15c are connected to the first touch electrodes 15a and the second touch electrodes 15b. Since the touch electrodes (14 and 15) are arranged in the aforementioned mesh-shaped circuit area 16, the touch electrodes (14 and 15) can constitute a mesh-shaped touch electrode. As shown in FIG. 4, the first touch electrodes 14a and the second touch electrodes 14b extending along the first direction Y overlap the circuit area 16 in the normal direction Z of the substrate 26. The first touch electrodes 15a and the second touch electrodes 15b extending along the second direction X overlap the circuit area 16 in the normal direction Z of the substrate 26. In the circuit area 16, the first touch electrodes 14a, the second touch electrodes 14b, and the third touch electrodes 14c do not overlap the light-emitting elements 24 in the normal direction Z of the substrate 26 and do not extend into the adjacent transparent areas 18, but is not limited thereto. It is worth noting that the first touch electrodes 14a, the second touch electrodes 14b, and the third touch electrodes 14c may, for example, surround each light-emitting element 24. In the embodiment shown in FIGS. 4-6, the touch electrodes (14 and 15) may include conductive materials, such as metals. The sensitivity of the touch electrode is related to the area occupied by the touch electrode, that is, the larger the touch area, the greater the sensitivity. Due to the arrangement of the first touch electrodes (14a and 15a), the second touch electrodes (14b and 15b), and the third touch electrodes (14c and 15c), the area of the overall mesh-shaped touch electrodes is increased, which can effectively improve touch sensitivity.

Referring to FIGS. 5 and 6, the detailed structure of the display unit 12 and the arrangement of the touch electrodes (14 and 15) are further illustrated by the cross-sectional schematic diagrams of the transparent touch display device 10. FIG. 5 mainly discloses the component structures in the circuit area 16 (including the signal lines 20, the pixel circuits 22, and the light-emitting elements 24) and in the adjacent transparent area 18 in the display unit 12. It is similar to the embodiment disclosed in FIG. 2 and will not be repeated here. FIG. 6 mainly discloses the component structures in the circuit area 16 (including the signal lines 20) and in the adjacent transparent area 18 in the display unit 12. It is similar to the embodiment disclosed in FIG. 3 and will not be repeated here.

Regarding the configuration of the touch electrode 14, as shown in FIG. 5, the touch electrode 14 (including the first touch electrode 14a, the second touch electrode 14b and the third touch electrode 14c (not shown)) is disposed on the planar layer 34 and located in the circuit area 16. The position of the touch electrode 14 (including the first touch electrode 14a, the second touch electrode 14b and the third touch electrode 14c (not shown)) corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 (including the first touch electrode 14a, the second touch electrode 14b and the third touch electrode 14c (not shown)) does not overlap the light-emitting element 24 in the normal direction Z of the substrate 26 and does not extend into the transparent area 18 adjacent to the circuit area 16, but is not limited thereto.

Regarding the configuration of the touch electrode 15, as shown in FIG. 6, the touch electrode 15 (including the first touch electrode 15a, the second touch electrode 15b and the third touch electrode 15c (not shown)) is disposed on the planar layer 34 and located in the circuit area 16. The position of the touch electrode 15 (including the first touch electrode 15a, the second touch electrode 15b and the third touch electrode 15c (not shown)) corresponds to the position of the retaining wall structure 30 and part of the signal lines 20. In other words, the position of the touch electrode 15 overlaps the position of the retaining wall structure 30 and part of the signal lines 20 in the normal direction Z of the substrate 26. The touch electrode 15 (including the first touch electrode 15a, the second touch electrode 15b and the third touch electrode 15c (not shown)) does not extend into the transparent area 18 adjacent to the circuit area 16, but is not limited thereto.

Figure 7:
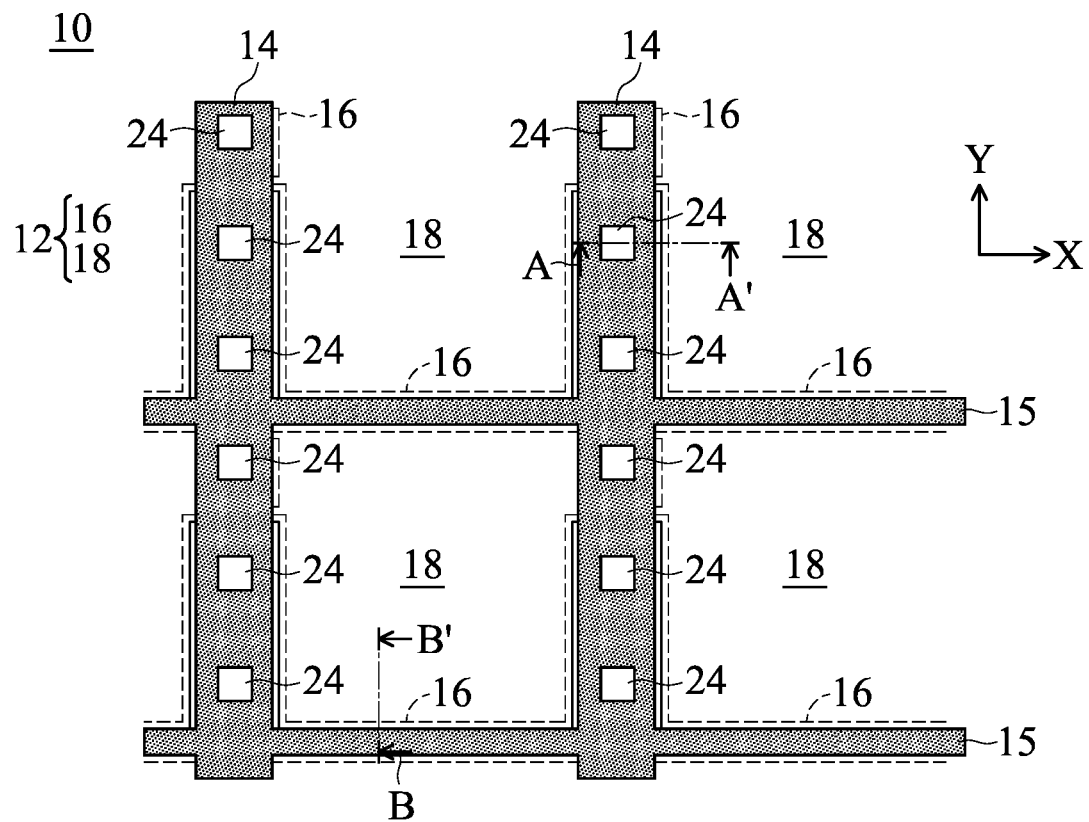
FIG. 7 is a schematic top view of a transparent touch display device in accordance with one embodiment of the present disclosure.
Figure 8:
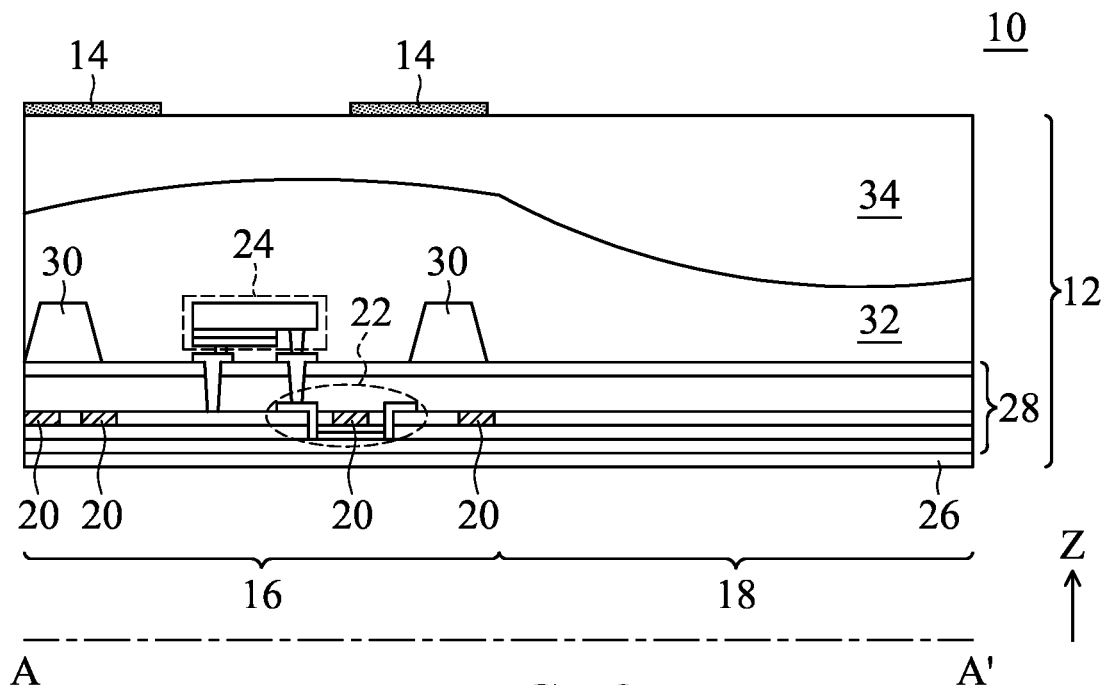
FIG. 8 is a schematic cross-sectional view of a transparent touch display device obtained along A-A' section line in FIG. 7 in accordance with one embodiment of the present disclosure.
Figure 9:
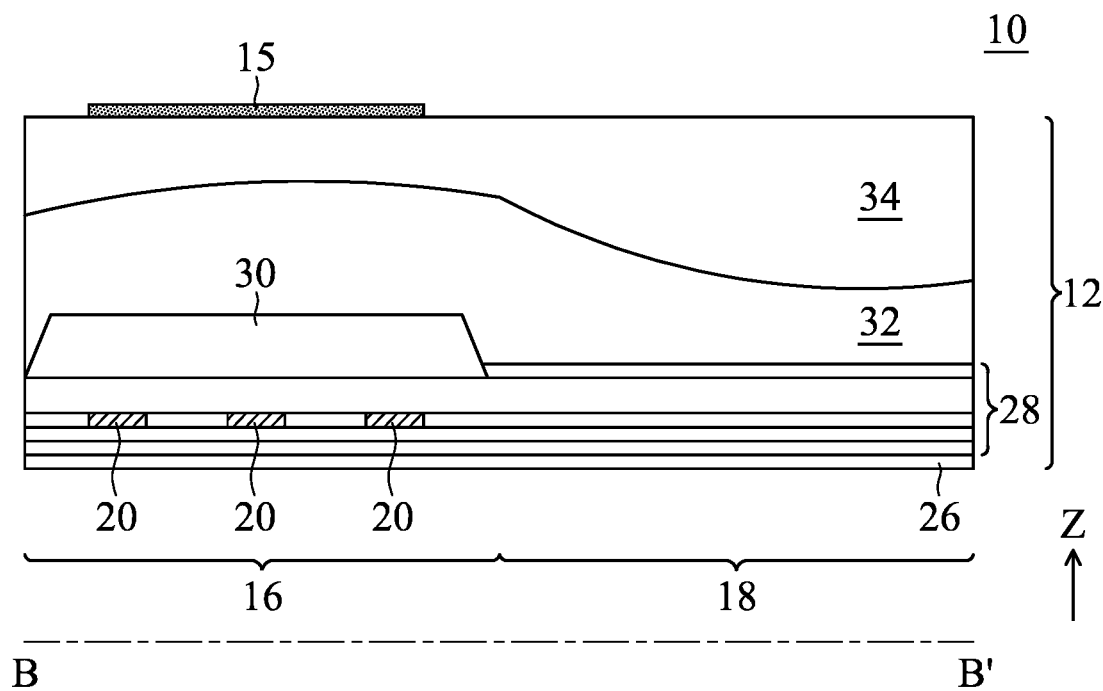
FIG. 9 is a schematic cross-sectional view of a transparent touch display device obtained along B-B' section line in FIG. 7 in accordance with one embodiment of the present disclosure.

Referring to FIGS. 7-9, in accordance with one embodiment of the present disclosure, a transparent touch display device 10 is provided. FIG. 7 is a schematic top view of the transparent touch display device 10. FIG. 8 is a schematic cross-sectional view obtained along A-A' section line in FIG. 7. FIG. 9 is a schematic cross-sectional view obtained along B-B' section line in FIG. 7.

In the embodiment shown in FIGS. 7-9, the transparent touch display device 10 includes a display unit 12 and touch electrodes (14 and 15). The display unit 12 includes a circuit area 16 and transparent areas 18. The configuration of the circuit area 16, the many components (including the signal lines 20, the pixel circuits 22, and the light-emitting elements 24) disposed in the area, and the electrical connection relationship thereamong (from top view) are similar to FIG. 1, and they are not repeated here. The transparent area 18 is defined as the area outside the circuit area 16.

The touch electrodes (14 and 15) refer to electrodes that receive touch drive signals or sense touch signals. In the embodiment shown in FIGS. 7-9, the circuit area 16 extending in the first direction Y is configured with the touch electrodes 14. Similarly, the circuit area 16 extending in the second direction X is configured with the touch electrodes 15. Since the touch electrodes (14 and 15) are arranged in the aforementioned mesh-shaped circuit area 16, the touch electrodes (14 and 15) may constitute a mesh-shaped touch electrode. As shown in FIG. 7, the touch electrodes 14 extending along the first direction Y, for example, completely overlap the circuit area 16 in the normal direction Z of the substrate 26, exposing the light-emitting elements 24. The touch electrodes 15 extending along the second direction X, for example, completely overlap the circuit area 16 in the normal direction Z of the substrate 26. In the circuit area 16, the touch electrodes 14 do not overlap the light-emitting elements 24 in the normal direction Z of the substrate 26 and do not extend into the transparent areas 18 adjacent to the circuit area 16, but is not limited thereto. In the embodiment shown in FIGS. 7-9, the touch electrodes (14 and 15) may include conductive materials, such as metals. Since the touch electrodes (14, 15), for example, are arranged to completely overlap the circuit area 16 in the normal direction Z of the substrate 26 to expose the light-emitting elements 24, the area of the overall mesh-shaped touch electrodes is increased, which can effectively improve touch sensitivity.

Referring to FIGS. 8 and 9, the detailed structure of the display unit 12 and the arrangement of the touch electrodes (14 and 15) are further illustrated by the cross-sectional schematic diagrams of the transparent touch display device 10. FIG. 8 mainly discloses the component structures in the circuit area 16 (including the signal lines 20, the pixel circuits 22, and the light-emitting elements 24) and in the adjacent transparent area 18 in the display unit 12. It is similar to the embodiment disclosed in FIG. 2 and will not be repeated here. FIG. 9 mainly discloses the component structures in the circuit area 16 (including the signal lines and in the adjacent transparent area 18 in the display unit 12. It is similar to the embodiment disclosed in FIG. 3 and will not be repeated here.

Regarding the configuration of the touch electrode 14, as shown in FIG. 8, the touch electrode 14 is disposed on the planar layer 34. For example, the touch electrode 14 completely overlap the circuit area 16 in the normal direction Z of the substrate 26 to expose the light-emitting elements 24. The position of the touch electrode 14 corresponds to the position of the retaining wall structures 30 and the signal lines 20. In other words, the position of the touch electrode 14 overlaps the position of the retaining wall structures 30 and the signal lines 20 in the normal direction Z of the substrate 26. The touch electrode 14 does not overlap the light-emitting element 24 in the normal direction Z of the substrate 26 and does not extend into the transparent area 18, but is not limited thereto.

Regarding the configuration of the touch electrode 15, as shown in FIG. 9, the touch electrode 15 is disposed on the planar layer 34. For example, the touch electrode 15 completely overlap the circuit area 16 in the normal direction Z of the substrate 26. The position of the touch electrode 15 corresponds to the position of the retaining wall structure and the signal lines 20. In other words, the position of the touch electrode 15 overlaps the position of the retaining wall structure 30 and the signal lines 20 in the normal direction Z of the substrate 26. The touch electrode 15 does not extend into the transparent area 18 adjacent to the circuit area 16, but is not limited thereto.

Figure 10:
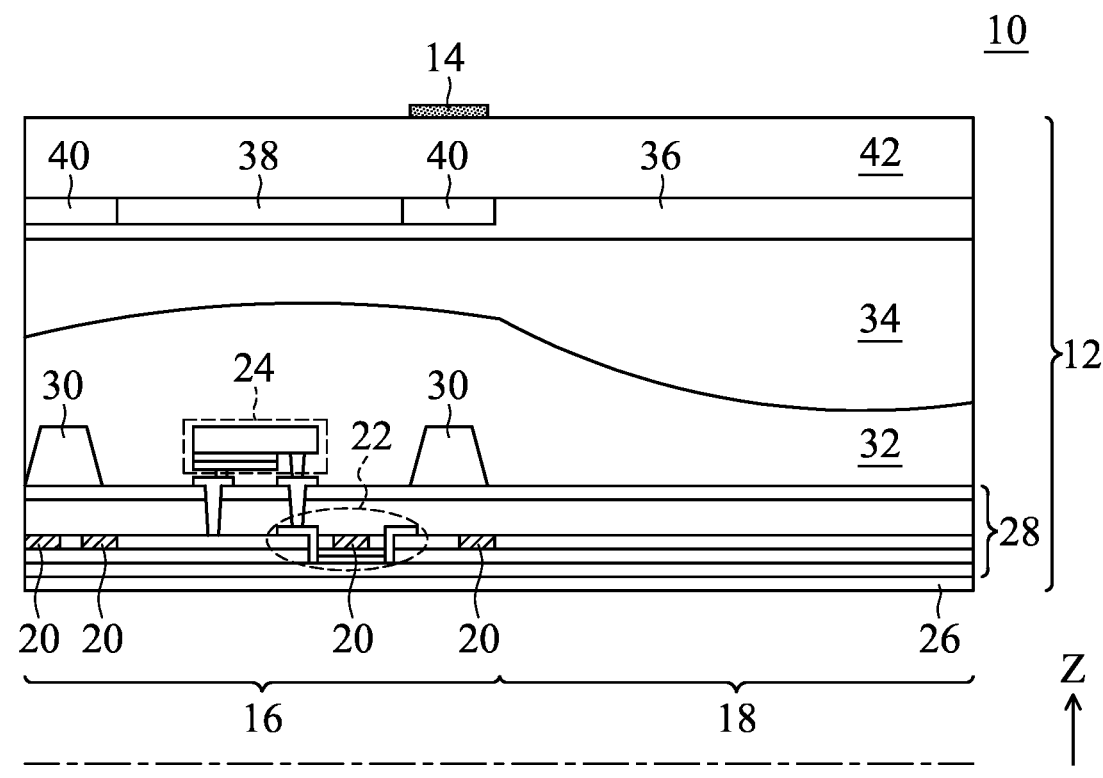
FIG. 10 is a schematic cross-sectional view of a part of a transparent touch display device in accordance with one embodiment of the present disclosure.

In accordance with one embodiment of the present disclosure, a transparent touch display device 10 is provided. Referring to FIG. 10, FIG. 10 is a schematic cross-sectional view of a part of the transparent touch display device 10.

In FIG. 10, the transparent touch display device 10 includes a display unit 12 and a touch electrode 14. The display unit 12 includes a circuit area 16 and a transparent area 18. The transparent touch display device 10 further includes a touch electrode 15 (not shown) intersecting the touch electrode 14. The configuration of the circuit area 16, the many components (for example, signal lines 20, pixel circuits 22, and light-emitting elements 24) disposed in the area, the electrical connection relationship thereamong, and the arrangement of the touch electrodes (14 and 15) (from top view) are similar to FIG. 1, and they are not repeated here. The touch electrodes (14 and 15) may include conductive materials, such as metals. The transparent area 18 is defined as the area outside the circuit area 16.

Referring to FIG. 10, the detailed structure of the display unit 12 and the arrangement of the touch electrode 14 are illustrated. The display unit 12 includes the circuit area 16 and the transparent area 18. The display unit 12 includes a substrate 26, an insulating layer 28, the signal lines 20, the pixel circuit 22, the light-emitting element 24, retaining wall structures 30, an encapsulation layer 32, a planar layer 34, a functional layer 36, a color conversion layer 38, retaining wall structures 40 and a substrate 42. The insulating layer 28 is disposed on the substrate 26. The signal lines 20 and the pixel circuit 22 are disposed in the insulating layer 28, are electrically connected to each other, and are located in the circuit area 16. The light-emitting element 24 is disposed on the insulating layer 28, is electrically connected to the pixel circuit 22, is driven by the pixel circuit 22, and is located in the circuit area 16. The retaining wall structures 30 are disposed on the insulating layer 28 and located in the circuit area 16. The retaining wall structures 30, for example, surround the light-emitting element 24. The encapsulation layer 32, for example, completely covers the insulating layer 28, the light-emitting element 24, and the retaining wall structures 30. The planar layer 34 is disposed on the encapsulation layer 32. The functional layer 36 is disposed on the planar layer 34. The color conversion layer 38 and the retaining wall structures 40 on both sides thereof are disposed between the substrate 42 and the planar layer 34, and are located in the circuit area 16. The substrate 42 is disposed on the functional layer 36, the color conversion layer 38 and the retaining wall structures 40. In some embodiments, the functional layer 36 may include an adhesive layer, a stress layer, an anti-reflection layer, a water blocking layer, an oxygen blocking layer, or a planar layer. In some embodiments, the color conversion layer 38 may include color photoresist or quantum dot materials. In some embodiments, the substrate 42 may include a soft substrate (for example, polyimide (PI)) or a hard substrate (for example, glass).

In accordance with FIG. 10, the fabrication of the display unit 12 with the color conversion layer 38 may include the following steps. First, the color conversion layer 38 and the retaining wall structures 40 on the both sides thereof are formed on the substrate 42. Next, the functional layer 36 covers the color conversion layer 38, the retaining wall structures 40 and the substrate 42. Next, the substrate 42 with the color conversion layer 38, the retaining wall structures 40 and the functional layer 36 thereon is attached to the planar layer 34, so that the color conversion layer 38 and the retaining wall structures 40 are disposed between the substrate 42 and the planar layer 34. The fabrication of the display unit 12 with the color conversion layer 38 is completed (this is a dual-board fabrication, that is, it is fabricated by bonding the substrate 42 and the substrate 26). In some embodiments (not shown), the fabrication of the display unit 12 with the color conversion layer 38 may also include the following steps. First, the color conversion layer 38 and the retaining wall structures 40 on the both sides thereof are formed on the planar layer 34. Next, the functional layer 36 covers the color conversion layer 38, the retaining wall structures 40 and the planar layer 34. The fabrication of the display unit 12 with the color conversion layer 38 is completed (this is a single-board fabrication, that is, it is fabricated by sequentially forming the color conversion layer 38 and the functional layer 36 on the single substrate 26). In some embodiments (not shown), the retaining wall structures 30 of the light-emitting element 24 and the retaining wall structures 40 of the color conversion layer 38 can be connected to form a continuous retaining wall structure. That is, the retaining wall structures 30 of the light-emitting element 24 extend upward to be connected to the retaining wall structures 40 of the color conversion layer 38.

Regarding the configuration of the touch electrode 14, as shown in FIG. 10, the touch electrode 14 is disposed on the substrate 42, and is located in the circuit area 16. The position of the touch electrode 14 corresponds to the position of the retaining wall structures 30, the retaining wall structures 40 and part of the signal lines 20. In other words, the position of the touch electrode 14 overlaps the position of the retaining wall structures 30, the retaining wall structures 40 and part of the signal lines 20 in the normal direction Z of the substrate 26. The touch electrode 14 does not overlap the light-emitting element 24 in the normal direction Z of the substrate 26 and does not extend into the transparent area 18 adjacent to the circuit area 16, but is not limited thereto.

The detailed structure of other parts of the display unit 12 is similar to that shown in FIG. 3 and will not be repeated here. The difference from FIG. 3 is that the display unit 12 further includes the functional layer 36 and the substrate 42, wherein the functional layer 36 is disposed on the planar layer 34, and the substrate 42 is disposed on the functional layer 36. In addition, the touch electrode 15 is disposed on the substrate 42 and located in the circuit area 16. The position of the touch electrode 15 corresponds to the position of the retaining wall structures 30 and part of the signal lines 20. In other words, the position of the touch electrode 15 overlaps the position of the retaining wall structures 30 and part of the signal lines 20 in the normal direction Z of the substrate 26. The touch electrode 15 does not extend into the transparent area 18 adjacent to the circuit area 16, but is not limited thereto.

Figure 11:
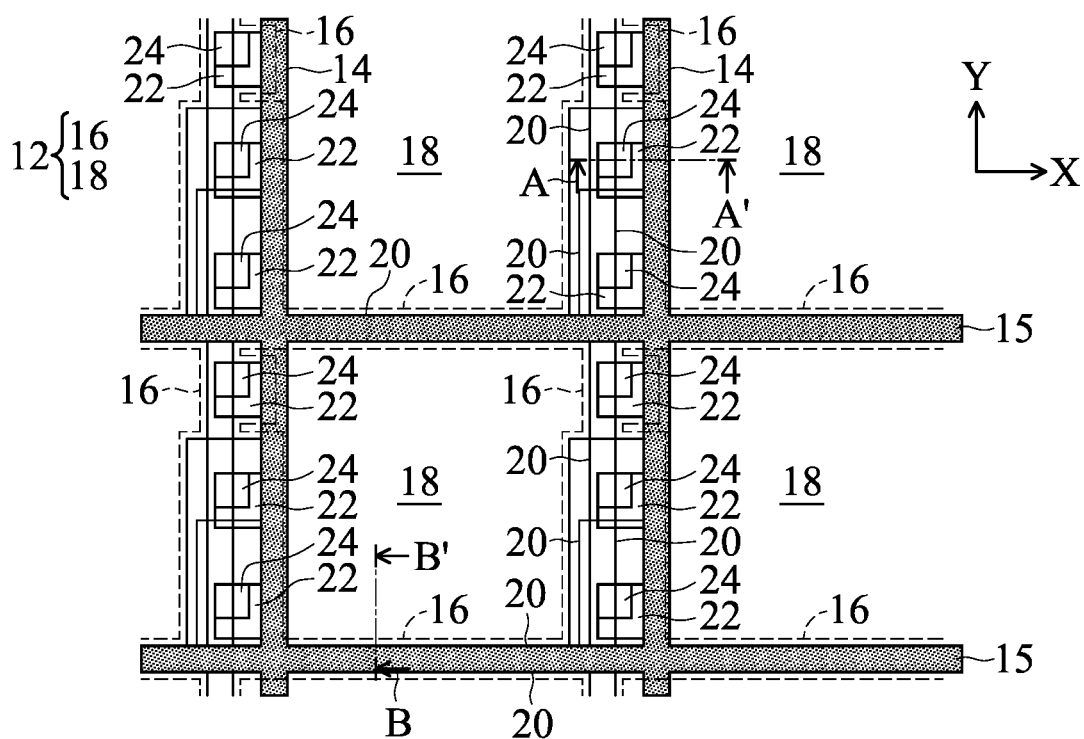
FIG. 11 is a schematic top view of a transparent touch display device in accordance with one embodiment of the present disclosure.
Figure 12:
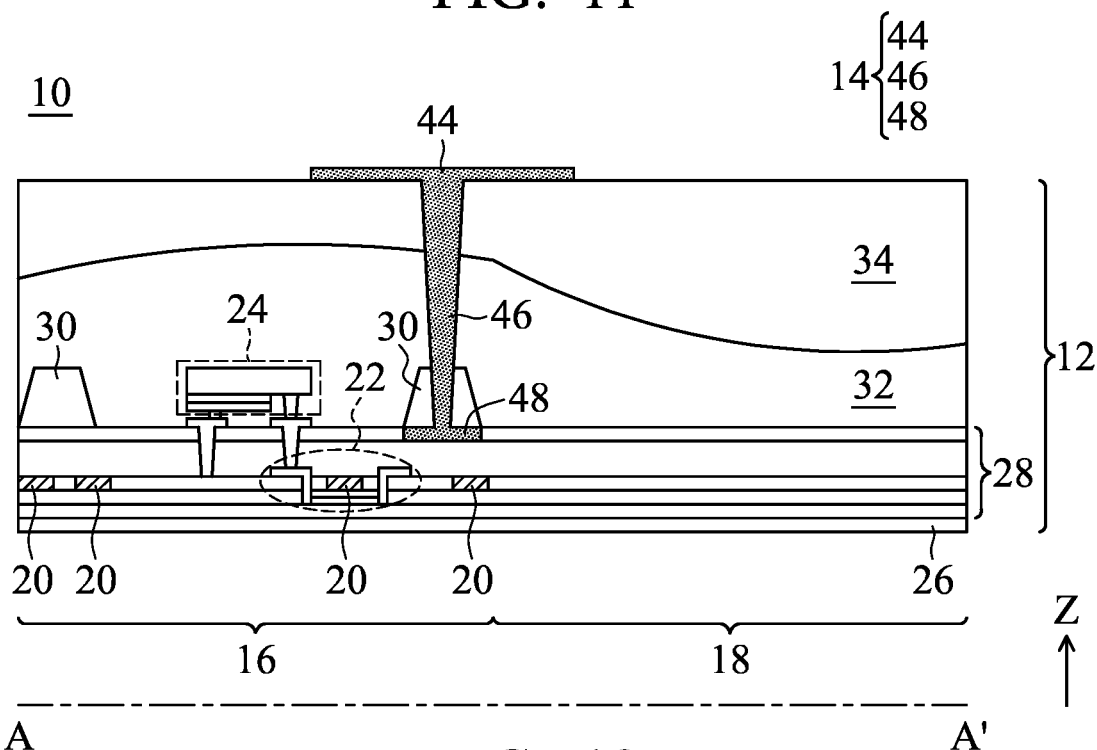
FIG. 12 is a schematic cross-sectional view of a transparent touch display device obtained along A-A' section line in FIG. 11 in accordance with one embodiment of the present disclosure.

Referring to FIGS. 11 and 12, in accordance with one embodiment of the present disclosure, a transparent touch display device 10 is provided. FIG. 11 is a schematic top view of the transparent touch display device 10. FIG. 12 is a schematic cross-sectional view obtained along A-A' section line in FIG. 11.

In the embodiment shown in FIGS. 11 and 12, the transparent touch display device 10 includes a display unit 12 and touch electrodes (14 and 15). The display unit 12 includes a circuit area 16 and transparent areas 18. The configuration of the circuit area 16, the many components (including signal lines 20, pixel circuits 22, and light-emitting elements 24) disposed in the area, and the electrical connection relationship thereamong (from top view) are similar to FIG. 1, and they are not repeated here. The transparent area 18 is defined as the area outside the circuit area 16.

The touch electrodes (14 and 15) refer to electrodes that receive touch drive signals or sense touch signals. In the embodiment shown in FIGS. 11 and 12, the circuit area 16 extending in the first direction Y is configured with the touch electrodes 14. Similarly, the circuit area 16 extending in the second direction X is configured with the touch electrodes 15. Since the touch electrodes (14 and 15) are arranged in the aforementioned mesh-shaped circuit area 16, the touch electrodes (14 and 15) can constitute a mesh-shaped touch electrode. As shown in FIG. 11, the touch electrodes 14 overlap a part of the circuit area 16 extending along the first direction Y and a part of the transparent areas 18 in the normal direction Z of the substrate 26. The touch electrodes 15, for example, completely overlap the circuit area 16 extending along the second direction X in the normal direction Z of the substrate 26. In the circuit area 16 extending along the first direction Y, the touch electrodes 14 do not overlap the light-emitting elements 24, but do extend into a part of the adjacent transparent areas 18. However, it is not limited thereto.

Referring to FIG. 12, the detailed structure of the display unit 12 and the arrangement of the touch electrodes 14 are further illustrated by the cross-sectional schematic diagrams of the transparent touch display device 10. FIG. 12 mainly discloses the component structures in the circuit area 16 (including the signal lines 20, the pixel circuits 22, and the light-emitting elements 24) and in the adjacent transparent area 18 in the display unit 12. It is similar to the embodiment disclosed in FIG. 2 and will not be repeated here.

Regarding the configuration of the touch electrode 14, as shown in FIG. 12, the touch electrode 14 includes a first portion 44, a second portion 46 and a third portion 48. The second portion 46 is electrically connected to the first portion 44 and the third portion 48, and the second portion 46 is between the first portion 44 and the third portion 48. The first portion 44 of the touch electrode 14 may be disposed on the planar layer 34. The second portion 46 of the touch electrode 14 may be disposed in the encapsulation layer 32 and the planar layer 34 (for example, disposed in the through hole of the encapsulation layer 32 and the planar layer 34). The third portion 48 of the touch electrode 14 may be disposed in the insulating layer 28 (but, for example, not covered by another sub-layer). The first portion 44 of the touch electrode 14 may include a transparent material such as indium tin oxide (ITO) as a touch electrode. The second portion 46 of the touch electrode 14 may include metal or indium tin oxide (ITO) to transmit touch signals. The third portion 48 of the touch electrode 14 may include metal and serve as a touch signal trace. The first portion 44 of the touch electrode 14 overlaps a part of the circuit area 16 extending in the first direction Y and a part of the transparent area 18. That is, the first portion 44 of the touch electrode 14 may cross the circuit area 16 and the transparent area 18 extending along the first direction Y. The position of the touch electrode 14 corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 does not overlap the light-emitting element 24 in the normal direction Z of the substrate 26, but does extend into a part of the adjacent transparent area 18. However, it is not limited thereto.

The detailed structure of other parts of the display unit 12 is similar to that shown in FIG. 3 and will not be repeated here. The difference from FIG. 3 is the structure and configuration of the touch electrode 15. The touch electrode 15 is located in the circuit area 16 extending along the second direction X, and its structure and configuration are similar to those of the touch electrode 14 shown in FIG. 12. In addition, the position of the touch electrode 15 corresponds to the position of the retaining wall structure 30 and the signal lines 20. In other words, the position of the touch electrode 15 overlaps the position of the retaining wall structure 30 and the signal lines 20 in the normal direction Z of the substrate 26. The touch electrode 15 does not extend into the adjacent transparent area 18, but is not limited thereto.

In the embodiment shown in FIGS. 11 and 12, the touch electrode (for example, the first portion 44 of the touch electrode 14) may be connected to an underneath metal trace (for example, the third portion 48 of the touch electrode 14) through a conductive connection (for example, the second portion 46 of the touch electrode 14). Since the touch electrodes (the material may include, for example, ITO) are connected to the metal traces with better conductivity, the touch electrodes do not need to be made on the entire surface, but can be made in a local area. In addition, since the ITO touch electrode has a lower effect on the aperture ratio, it can produce a larger touch area (across the circuit area and the transparent area) than a metal touch electrode, which can effectively improve the sensitivity.

Figure 13:
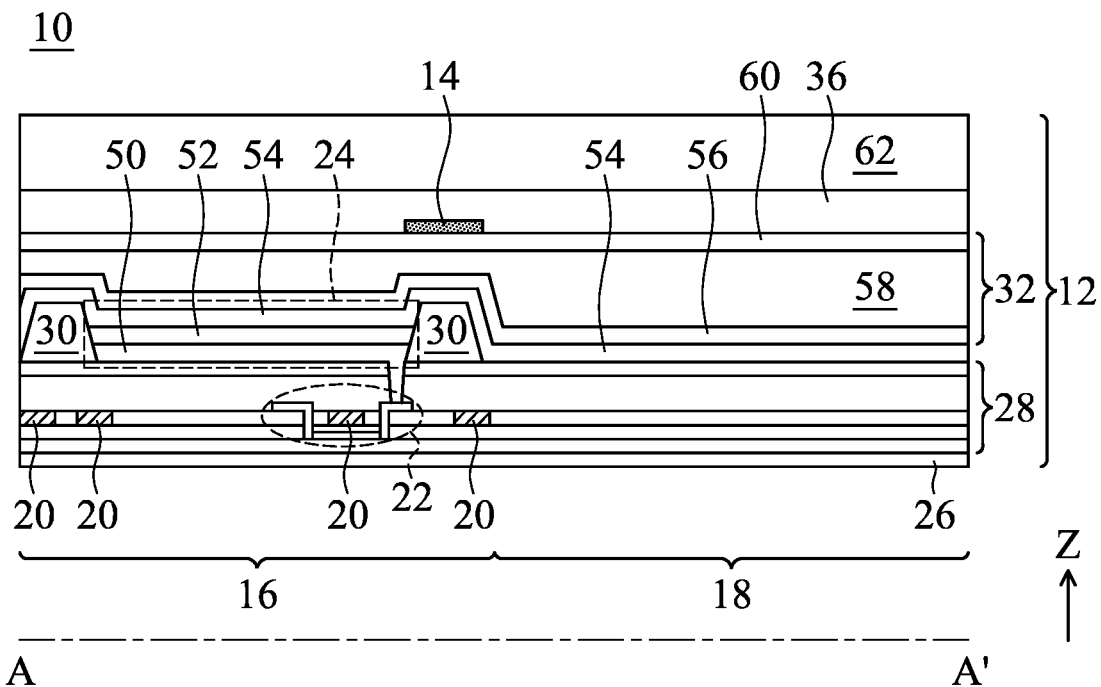
FIG. 13 is a schematic cross-sectional view of a transparent touch display device in accordance with one embodiment of the present disclosure.
Figure 14:
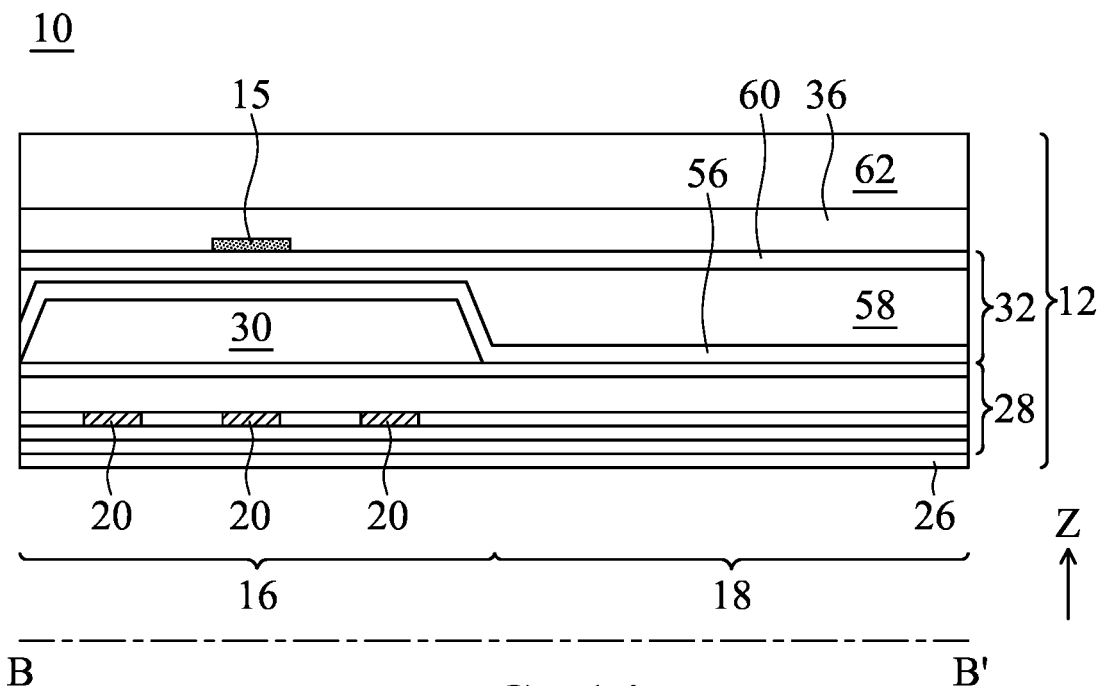
FIG. 14 is a schematic cross-sectional view of a transparent touch display device in accordance with one embodiment of the present disclosure.

Referring to FIGS. 13 and 14, in accordance with one embodiment of the present disclosure, a transparent touch display device 10 is provided. FIG. 13 is a schematic cross-sectional view of the transparent touch display device 10 (including a first circuit area and an adjacent transparent area). FIG. 14 is a schematic cross-sectional view of the transparent touch display device 10 (including a second circuit area and an adjacent transparent area).

In FIG. 13, the transparent touch display device 10 includes a display unit 12 and a touch electrode 14. The display unit 12 includes a circuit area 16 extending along the first direction Y and an adjacent transparent area 18. In FIG. 14, the transparent touch display device 10 includes a display unit 12 and a touch electrode 15. The display unit 12 includes a circuit area 16 extending along the second direction X and an adjacent transparent area 18. The configuration of the circuit area 16, the many components (including signal lines 20, pixel circuits 22, and light-emitting elements 24) disposed in the area, the electrical connection relationship thereamong, and the arrangement of the touch electrodes (14 and 15) (from top view) are similar to FIG. 1, and they are not repeated here. The touch electrodes (14 and 15) may include conductive materials, such as metal. The transparent area 18 is defined as the area outside the circuit area 16.

Referring to FIG. 13, the detailed structure of the display unit 12 and the arrangement of the touch electrode 14 are illustrated. The display unit 12 includes the circuit area 16 extending along the first direction Y and the transparent area 18. The display unit 12 includes a substrate 26, an insulating layer 28, the signal lines 20, the pixel circuit 22, the light-emitting element 24, retaining wall structures 30, an encapsulation layer 32, a functional layer 36, and a cover layer 62. The insulating layer 28 is disposed on the substrate 26. The signal lines 20 and the pixel circuit 22 are disposed in the insulating layer 28, are electrically connected to each other, and are located in the circuit area 16. The light-emitting element 24 is disposed on the insulating layer 28, is electrically connected to the pixel circuit 22, is driven by the pixel circuit 22, and is located in the circuit area 16. In FIG. 13, the light-emitting element 24 may include a top-emission OLED, and its structure includes an anode 50, an organic light-emitting layer 52 and a cathode 54. The anode 50 is disposed on the insulating layer 28. The organic light-emitting layer 52 is disposed on the anode 50. The cathode 54 is disposed on the organic light-emitting layer 52 and extends to cover the retaining wall structures 30 and the insulating layer 28. The retaining wall structures 30 are disposed on the insulating layer 28 and located in the circuit area 16. The retaining wall structures 30, for example, surround the light-emitting element 24. The encapsulation layer 32, for example, completely covers the insulating layer 28, the light-emitting element 24, and the retaining wall structures 30. The encapsulation layer 32 includes a first inorganic layer 56, an organic layer 58 and a second inorganic layer 60. The first inorganic layer 56 is disposed on the cathode 54. The organic layer 58 is disposed on the first inorganic layer 56. The second inorganic layer 60 is disposed on the organic layer 58. The functional layer 36 is disposed on the encapsulation layer 32. The cover layer 62 is disposed on the functional layer 36. In some embodiments, the functional layer 36 may include an adhesive layer, a stress layer, an anti-reflection layer, a water blocking layer, an oxygen blocking layer, or a planar layer. In some embodiments, the cover layer 62 may include a soft cover layer (for example, polyimide (PI)) or a hard cover layer (for example, glass).

Regarding the configuration of the touch electrode 14, as shown in FIG. 13, the touch electrode 14 is disposed on the second inorganic layer 60 in the encapsulation layer 32 and located in the circuit area 16. The touch electrode 14 is covered by the functional layer 36. The position of the touch electrode 14 corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 does not overlap the light-emitting element 24 in the normal direction Z of the substrate 26 and does not extend into the adjacent transparent area 18, but is not limited thereto.

Referring to FIG. 14, the detailed structure of the display unit 12 and the arrangement of the touch electrode 15 are illustrated. The display unit 12 includes the circuit area 16 extending along the second direction X and the transparent area 18. The display unit 12 includes a substrate 26, an insulating layer 28, the signal lines 20, a retaining wall structure 30, an encapsulation layer 32, a functional layer 36, and a cover layer 62. The insulating layer 28 is disposed on the substrate 26. The signal lines 20 are disposed in the insulating layer 28 and located in the circuit area 16. The retaining wall structure 30 is disposed on the insulating layer 28 and located in the circuit area 16. The encapsulation layer 32 completely covers the insulating layer 28 and the retaining wall structure 30. The encapsulation layer 32 includes a first inorganic layer 56, an organic layer 58 and a second inorganic layer 60. The first inorganic layer 56 is disposed on the insulating layer 28 and the retaining wall structure 30. The organic layer 58 is disposed on the first inorganic layer 56. The second inorganic layer is disposed on the organic layer 58. The functional layer 36 is disposed on the encapsulation layer 32. The cover layer 62 is disposed on the functional layer 36.

Regarding the configuration of the touch electrode 15, as shown in FIG. 14, the touch electrode 15 is disposed on the second inorganic layer 60 in the encapsulation layer 32 and located in the circuit area 16. The touch electrode 15 is covered by the functional layer 36. The position of the touch electrode 15 corresponds to the position of the retaining wall structure 30 and part of the signal lines 20. In other words, the position of the touch electrode overlaps the position of the retaining wall structure 30 and part of the signal lines 20 in the normal direction Z of the substrate 26. The touch electrode 15 does not extend into the transparent area 18 adjacent to the circuit area 16, but is not limited thereto.

Figure 15:
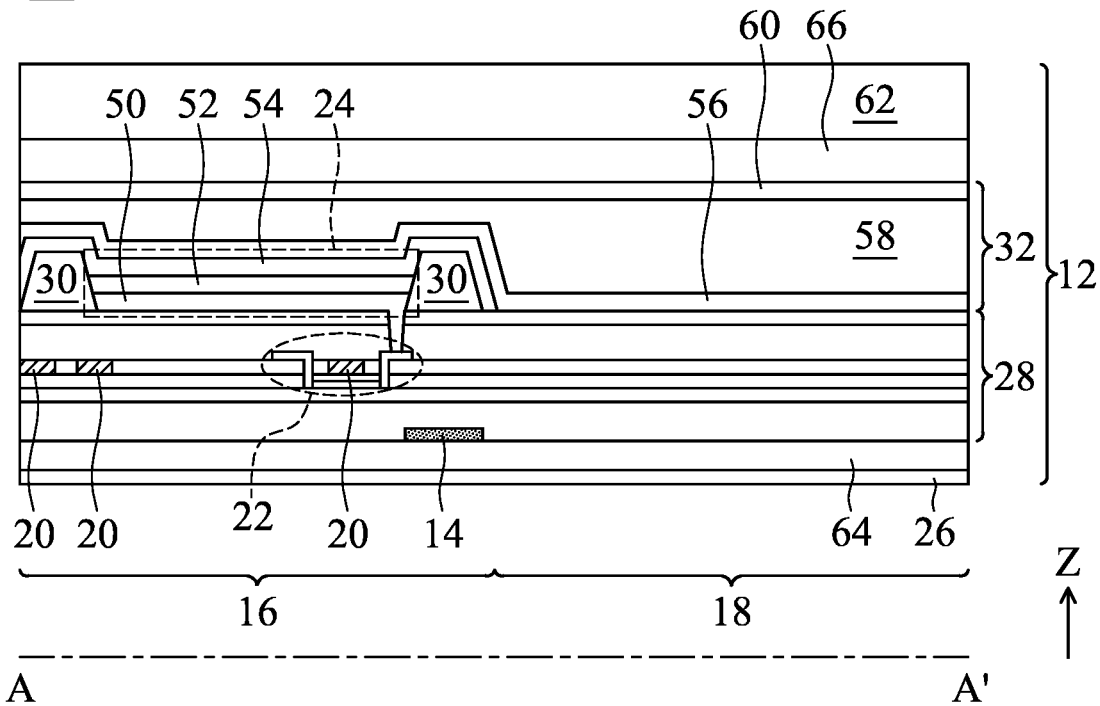
FIG. 15 is a schematic cross-sectional view of a transparent touch display device in accordance with one embodiment of the present disclosure.
Figure 16:
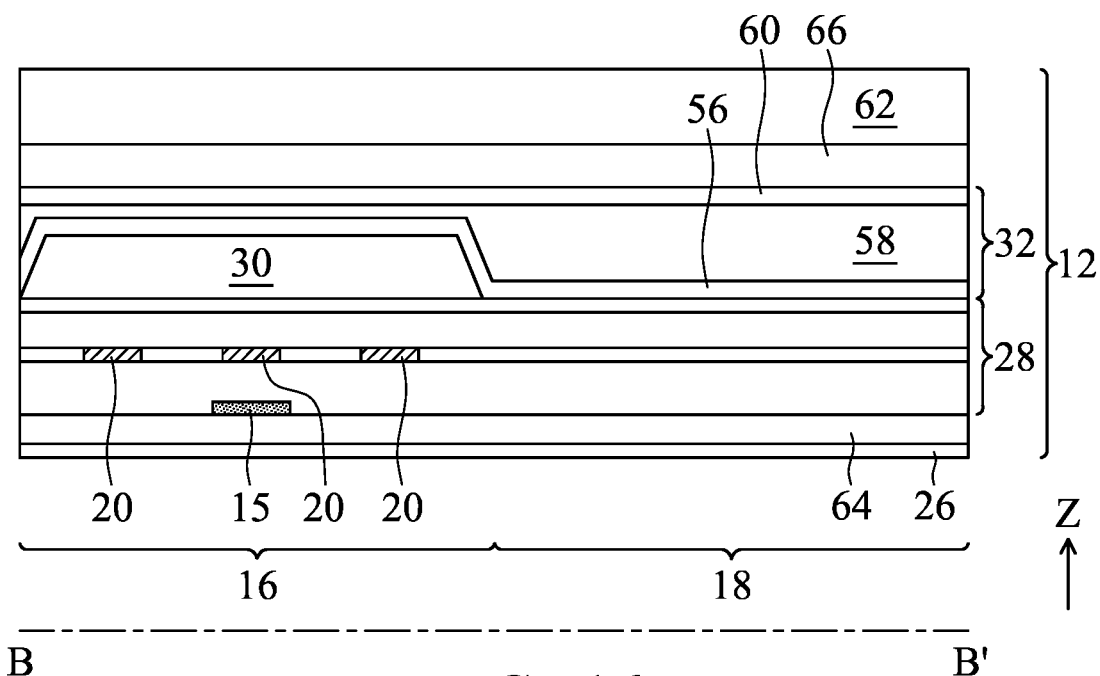
FIG. 16 is a schematic cross-sectional view of a transparent touch display device in accordance with one embodiment of the present disclosure.

Referring to FIGS. 15 and 16, in accordance with one embodiment of the present disclosure, a transparent touch display device 10 is provided, wherein FIG. 15 is a schematic cross-sectional view of the transparent touch display device 10 (including a circuit area 16 extending along a first direction Y and an adjacent transparent area 18), and FIG. 16 is a schematic cross-sectional view of the transparent touch display device 10 (including a circuit area 16 extending along a second direction X and an adjacent transparent area 18).

In FIG. 15, the transparent touch display device 10 includes a display unit 12 and a touch electrode 14. The display unit 12 includes the circuit area 16 extending along the first direction Y and the adjacent transparent area 18. In FIG. 16, the transparent touch display device 10 includes a display unit 12 and a touch electrode 15. The display unit 12 includes the circuit area 16 extending along the second direction X and the adjacent transparent area 18. The configuration of the circuit area 16, the many components (including signal lines 20, pixel circuits 22, and light-emitting elements 24) disposed in the area, the electrical connection relationship thereamong, and the arrangement of the touch electrodes (14 and 15) (from top view) are similar to FIG. 1, and they are not repeated here. The touch electrodes (14 and 15) may include conductive materials, such as metal. The transparent area 18 is defined as the area outside the circuit area 16.

Referring to FIG. 15, the detailed structure of the display unit 12 and the arrangement of the touch electrode 14 are illustrated. The display unit 12 includes the circuit area 16 extending along the first direction Y and the transparent area 18. The display unit 12 includes a substrate 26, a first functional layer 64, an insulating layer 28, the signal lines 20, the pixel circuit 22, the light-emitting element 24, retaining wall structures 30, an encapsulation layer 32, a second functional layer 66, and a cover layer 62. The first functional layer 64 is disposed on the substrate 26. The insulating layer 28 is disposed on the first functional layer 64. The signal lines 20 and the pixel circuit 22 are disposed in the insulating layer 28, are electrically connected to each other, and are located in the circuit area 16. The light-emitting element 24 is disposed on the insulating layer 28, is electrically connected to the pixel circuit 22, is driven by the pixel circuit 22, and is located in the circuit area 16. In FIG. 15, the light-emitting element 24 may include a bottom-emission OLED, and its structure includes an anode 50, an organic light-emitting layer 52 and a cathode 54. The anode 50 is disposed on the insulating layer 28. The organic light-emitting layer 52 is disposed on the anode 50. The cathode 54 is disposed on the organic light-emitting layer 52 and extends to cover the retaining wall structures 30. In some embodiments, the material of the cathode 54 is a metal with reflective properties. The retaining wall structures 30 are disposed on the insulating layer 28 and located in the circuit area 16. The retaining wall structures 30, for example, surround the light-emitting element 24. The encapsulation layer 32, for example, completely covers the insulating layer 28, the light-emitting element 24, and the retaining wall structures 30. The encapsulation layer 32 includes a first inorganic layer 56, an organic layer 58 and a second inorganic layer 60. The first inorganic layer 56 is disposed on the insulating layer 28, the light-emitting element 24 and the retaining wall structures 30. The organic layer 58 is disposed on the first inorganic layer 56. The second inorganic layer 60 is disposed on the organic layer 58. The second functional layer 66 is disposed on the encapsulation layer 32. The cover layer 62 is disposed on the second functional layer 66. In some embodiments, the first functional layer 64 and the second functional layer 66 may include an adhesive layer, a stress layer, an anti-reflection layer, a water blocking layer, an oxygen blocking layer, or a planar layer. In some embodiments, one of the first functional layer 64 and the second functional layer 66 can be omitted. In some embodiments, the cover layer 62 may include a soft cover layer (for example, polyimide (PI)) or a hard cover layer (for example, glass).

Regarding the configuration of the touch electrode 14, as shown in FIG. 15, the touch electrode 14 is disposed on the first functional layer 64 and located in the circuit area 16. The touch electrode 14 is covered by the insulating layer 28. The position of the touch electrode 14 corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 does not overlap the light-emitting element 24 in the normal direction Z of the substrate 26 and does not extend into the transparent area 18 adjacent to the circuit area 16, but is not limited thereto.

Referring to FIG. 16, the detailed structure of the display unit 12 and the arrangement of the touch electrode 15 are illustrated. The display unit 12 includes the circuit area 16 extending along the second direction X and the transparent area 18. The display unit 12 includes a substrate 26, a first functional layer 64, an insulating layer 28, the signal lines 20, a retaining wall structure 30, an encapsulation layer 32, a second functional layer 66, and a cover layer 62. The first functional layer 64 is disposed on the substrate 26. The insulating layer 28 is disposed on the first functional layer 64. The signal lines 20 are disposed in the insulating layer 28 and located in the circuit area 16. The retaining wall structure 30 is disposed on the insulating layer 28 and located in the circuit area 16. The encapsulation layer 32, for example, completely covers the insulating layer 28 and the retaining wall structure 30. The encapsulation layer 32 includes a first inorganic layer 56, an organic layer 58 and a second inorganic layer 60. The first inorganic layer 56 is disposed on the insulating layer 28 and the retaining wall structure 30. The organic layer 58 is disposed on the first inorganic layer 56. The second inorganic layer 60 is disposed on the organic layer 58. The second functional layer 66 is disposed on the encapsulation layer 32. The cover layer 62 is disposed on the second functional layer 66.

Regarding the configuration of the touch electrode 15, as shown in FIG. 16, the touch electrode 15 is disposed on the first functional layer 64 and located in the circuit area 16. The touch electrode 15 is covered by the insulating layer 28. The position of the touch electrode 15 corresponds to the position of the retaining wall structure 30 and part of the signal lines 20. In other words, the position of the touch electrode 15 overlaps the position of the retaining wall structure 30 and part of the signal lines 20 in the normal direction Z of the substrate 26. The touch electrode 15 does not extend into the transparent area 18 adjacent to the circuit area 16, but is not limited thereto.

Figure 17:
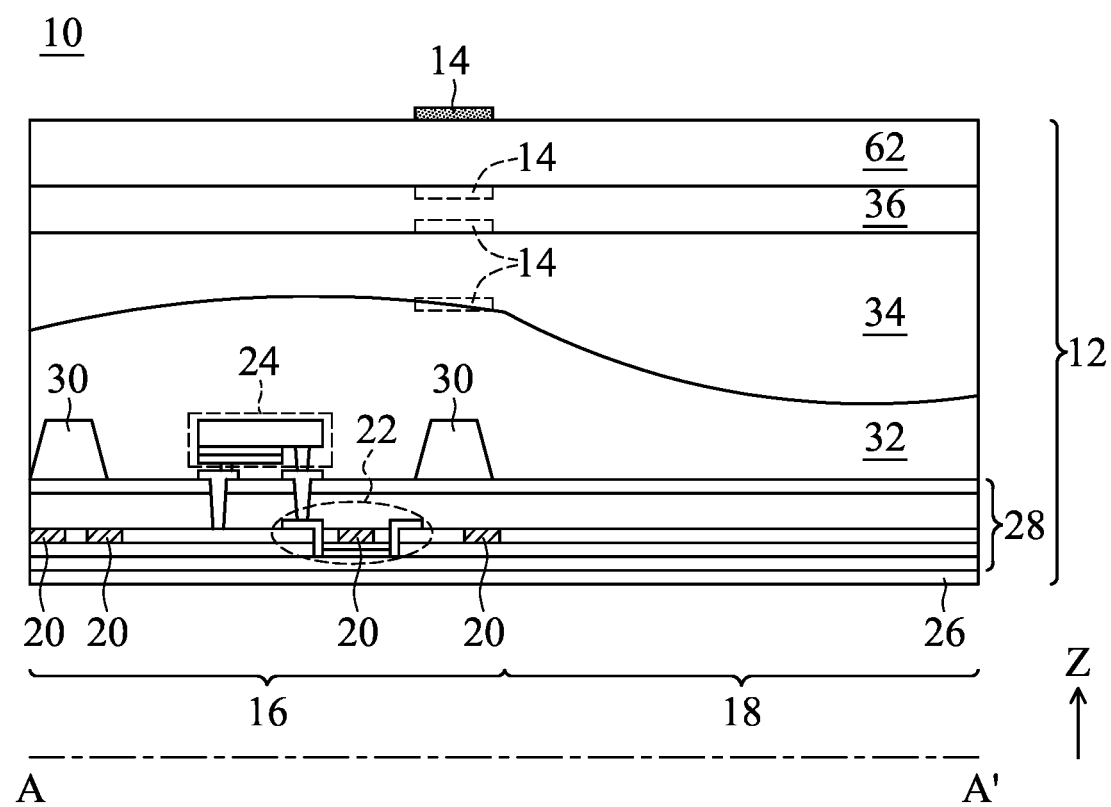
FIG. 17 is a schematic cross-sectional view of a transparent touch display device in accordance with one embodiment of the present disclosure.

Referring to FIG. 17, in accordance with one embodiment of the present disclosure, a transparent touch display device 10 is provided. FIG. 17 is a schematic cross-sectional view of the transparent touch display device 10.

In FIG. 17, the transparent touch display device 10 includes a display unit 12 and a touch electrode 14. The display unit 12 includes a circuit area 16 extending along a first direction Y and a transparent area 18. The transparent touch display device 10 further includes a touch electrode 15 (not shown) intersecting the touch electrode 14. The configuration of the circuit area 16, the many components (for example, signal lines 20, pixel circuits 22, and light-emitting elements 24) disposed in the area and the electrical connection relationship thereamong, and the arrangement of the touch electrodes (14 and 15) (from top view) are similar to FIG. 1, and they are not repeated here. The touch electrodes (14 and 15) may include conductive materials, such as metals. The transparent area 18 is defined as the area outside the circuit area 16.

Referring to FIG. 17, the detailed structure of the display unit 12 and the arrangement of the touch electrode 14 are illustrated. The display unit 12 includes the circuit area 16 extending along the first direction Y and the transparent area 18. The display unit 12 includes a substrate 26, an insulating layer 28, the signal lines 20, the pixel circuit 22, the light-emitting element 24, retaining wall structures 30, an encapsulation layer 32, a planar layer 34, a functional layer 36, and a cover layer 62. The insulating layer 28 is disposed on the substrate 26. The signal lines 20 and the pixel circuit 22 are disposed in the insulating layer 28, are electrically connected to each other, and are located in the circuit area 16. The light-emitting element 24 is disposed on the insulating layer 28, is electrically connected to the pixel circuit 22, is driven by the pixel circuit 22, and is located in the circuit area 16. The retaining wall structures 30 are disposed on the insulating layer 28 and located in the circuit area 16. The retaining wall structures 30, for example, surround the light-emitting element 24. The encapsulation layer 32, for example, completely covers the insulating layer 28, the light-emitting element 24, and the retaining wall structures 30. The planar layer 34 is disposed on the encapsulation layer 32. The functional layer 36 is disposed on the planar layer 34. The cover layer 62 is disposed on the functional layer 36. In some embodiments, the functional layer 36 may include an adhesive layer, a stress layer, an anti-reflection layer, a water blocking layer, an oxygen blocking layer, or a planar layer. In some embodiments, the cover layer 62 may include a soft cover layer (for example, polyimide (PI)) or a hard cover layer (for example, glass).

Regarding the configuration of the touch electrode 14, as shown in FIG. 17, the touch electrode 14 is disposed on the cover layer 62 and located in the circuit area 16. The position of the touch electrode 14 corresponds to the position of the retaining wall structure 30 and part of the signal lines 20. In other words, the position of the touch electrode 14 overlaps the position of the retaining wall structure 30 and part of the signal lines 20 in the normal direction Z of the substrate 26. The touch electrode 14 does not overlap the light-emitting element 24 in the normal direction Z of the substrate 26 and does not extend into the transparent area 18 adjacent to the circuit area 16, but is not limited thereto. In some embodiments, the touch electrode 14 may include a corrosion-resistant metal material. In some embodiments, the transparent touch display device 10 may further include a protective layer (not shown) to cover the touch electrode 14.

In the embodiment shown in FIG. 17, there are many other options for the position where the touch electrode 14 is disposed in the circuit area 16. For example, in some embodiments, the touch electrode 14 may be disposed between the encapsulation layer 32 and the planar layer 34. In some embodiments, the touch electrode 14 may be disposed on the planar layer 34 and covered by the functional layer 36. In some embodiments, the touch electrode 14 may be disposed between the functional layer 36 and the cover layer 62, but is not limited thereto.

The detailed structure (not shown) of other parts of the display unit 12 is similar to that shown in FIG. 3 and will not be repeated here. The difference from FIG. 3 is that the display unit 12 further include the functional layer 36 and the cover layer 62, wherein the functional layer 36 is disposed on the planar layer 34, and the cover layer 62 is disposed on the functional layer 36. In addition, the position where the touch electrode 15 is disposed in the circuit area 16 is similar to that of the touch electrode 14 in FIG. 17 and will not be repeated here.

In other embodiments, the above embodiments may be applied to a mirror display. For example, a reflective layer may be provided in the light-transmitting area. The reflective layer may be provided on any of the above-mentioned layers. In a mirror display, the metal in the circuit area can transmit signals, but the reflective layer in the light-transmitting area has no signal. For example, it may be a dummy reflective layer, which is electrically insulated from the metal in the circuit area. The difference between the mirror display and the reflective display is that the reflective display presents the image to the user by reflection, but the mirror display is a mirror with partial display function. The mirror display may be used in car rearview mirrors, or smart display mirrors in shopping malls, but it is not limited thereto.

In the disclosed transparent touch display device, opaque elements such as signal lines, pixel circuits, and light-emitting elements are collectively disposed in the mesh-shaped circuit area of the display unit, so that the display unit can maintain a large transparent area. The touch electrodes are arranged in the circuit area to form mesh-shaped touch electrodes. Since the touch electrode overlaps the circuit area and reduces the area extending into the transparent area, a high aperture ratio can be maintained. The electrode structure design increases the area of the overall mesh-shaped touch electrode, which can effectively improve the touch sensitivity. The configuration of the disclosed mesh-shaped touch electrode can be widely used in, for example, a display unit structure with a color conversion layer, a top-emission OLED, or a bottom-emission OLED. According to the present disclosure, if a transparent ITO material is used as the touch electrode, the touch electrode can be electrically connected to the underneath metal traces with better conductivity, so that the touch electrode does not need to be made on the entire surface, but can be made in a local area. Since ITO touch electrodes have less influence on the aperture ratio, ITO touch electrodes can produce a larger touch area (across the circuit area and the transparent area) than metal touch electrodes, which contributes to the improvement of sensitivity. In addition, the mesh-shaped touch electrodes of the present disclosure may be disposed on any appropriate layer in the display unit, for example, may be disposed on the cover layer, between the encapsulation layer and the planar layer, on the planar layer, or on the surface of the functional layer.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A transparent display device, comprising:
    a display unit having a circuit area and a plurality of transparent areas, and comprising:
        a plurality of signal lines located in the circuit area;
        a plurality of pixel circuits electrically connected to the signal lines and located in the circuit area;
        a plurality of light-emitting elements driven by the pixel circuits and located in the circuit area; and
        an encapsulation layer located in the circuit area and the plurality of transparent areas, wherein the encapsulation layer has a curved surface and a portion of the curved surface is corresponding to the circuit area;
    wherein each transparent area is enclosed by the circuit area,
    wherein a first thickness of the encapsulation layer located in the circuit area is different from a second thickness of the encapsulation layer located in one of the plurality of transparent areas.

2. The transparent display device as claimed in claim 1, wherein the first thickness of the encapsulation layer located in the circuit area is larger than the second thickness of the encapsulation layer located in the one of the plurality of transparent area.

3. The transparent display device as claimed in claim 1, wherein the encapsulation layer completely covers the light-emitting elements.

4. The transparent display device as claimed in claim 1, further comprising a plurality of retaining wall structures located in the circuit area.

5. The transparent display device as claimed in claim 4, wherein one of the plurality of light-emitting elements is disposed between two adjacent of the plurality of retaining wall structures.

6. The transparent display device as claimed in claim 1, wherein the portion of the curved surface has a first curvature, another portion of the curved surface is corresponding to the one of the plurality of transparent area and has a second curvature, and the first curvature and the second curvature are different.

7. The transparent display device as claimed in claim 1, wherein the portion of the curved surface has a first height, another portion of the curved surface has a second height, and the first height is higher than the second height.

8. A transparent display device, comprising:
    a display unit, comprising:
        a circuit area, comprising:
            a plurality of signal lines;
            a plurality of pixel circuits electrically connected to the signal lines; and
            a plurality of light-emitting elements driven by the pixel circuits;
        a plurality of transparent areas; and
        an encapsulation layer located in the circuit area and the plurality of transparent areas, wherein the encapsulation layer has a curved surface and a portion of the curved surface is corresponding to the circuit area;

wherein each transparent area is enclosed by the circuit area, wherein the transparent area does not overlap the plurality of light-emitting elements.

9. The transparent display device as claimed in claim 8, further comprising a plurality of retaining wall structures located in the circuit area.

10. The transparent display device as claimed in claim 9, wherein one of the plurality of light-emitting elements is disposed between two adjacent of the plurality of retaining wall structures.

11. The transparent display device as claimed in claim 8, further comprising a color conversion layer located in the circuit area.

12. The transparent display device as claimed in claim 11, wherein the color conversion layer overlaps at least one of the plurality of light-emitting elements.

* * * * *